(12) United States Patent
Breslow et al.

(10) Patent No.: US 10,409,343 B2
(45) Date of Patent: Sep. 10, 2019

(54) CONTROL SYSTEM AND ARCHITECTURE FOR INCORPORATING MICROELECTROMECHANICAL (MEM) SWITCHES IN FLUID-BASED COOLING OF 3D INTEGRATED CIRCUITS

(71) Applicant: Advanced Micro Devices, Inc., Sunnyvale, CA (US)

(72) Inventors: Alexander D. Breslow, Sunnyvale, CA (US); Dong Ping Zhang, Sunnyvale, CA (US); Nuwan Jayasena, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 426 days.

(21) Appl. No.: 15/191,896

(22) Filed: Jun. 24, 2016

(65) Prior Publication Data

US 2017/0371386 A1    Dec. 28, 2017

(51) Int. Cl.
*G06F 1/20* (2006.01)
*H01L 23/473* (2006.01)
*G05B 15/02* (2006.01)
*G05D 7/06* (2006.01)

(52) U.S. Cl.
CPC ............ *G06F 1/206* (2013.01); *G05B 15/02* (2013.01); *G05D 7/0676* (2013.01); *H01L 23/473* (2013.01)

(58) Field of Classification Search
CPC ..................................................... G06F 1/206
USPC ............................................................ 700/282
See application file for complete search history.

(56) References Cited

U.S. PATENT DOCUMENTS

| | | | | |
|---|---|---|---|---|
| 6,606,251 B1* | 8/2003 | Kenny, Jr. | ............... | G06F 1/26 257/E23.067 |
| 2003/0106596 A1* | 6/2003 | Yang | ........................ | F15C 5/00 137/828 |
| 2012/0044339 A1* | 2/2012 | Stith | ................... | G01N 21/6458 348/79 |
| 2015/0029658 A1* | 1/2015 | Yairi | ........................ | G06F 1/20 361/679.47 |

OTHER PUBLICATIONS

Coskun, A. et al., "Energy-Efficient Variable-Flow Liquid Cooling in 3D Stacked Architectures", 2010 Design, Automation & Test in Europe Conference & Exhibition (Date 2010), Mar. 8-12, 2010, pp. 111-116, IEEE, Dresden, DE.

(Continued)

*Primary Examiner* — Hoai V Ho
(74) *Attorney, Agent, or Firm* — Volpe and Koenig, P.C.

(57) ABSTRACT

A cooling system is provided for a 3D integrated circuit (IC) to deliver fluid in x, y, and z dimensions to interior regions of the IC as a means to regulate heat. An IC includes a microfluidic network of channels, at least one sensor and at least one microelectromechanical system (MEMS)-based device that is disposed within the network of channels and that is configured to regulate a flow of fluid within the network of channels. Each sensor monitors a state of the IC. Each MEMS-based device receives control signals based on a state of the IC and regulates a flow of fluid within the network of channels based on control signals that area received on a real-time basis based on changes detected in a state of the IC.

19 Claims, 7 Drawing Sheets

(56) References Cited

OTHER PUBLICATIONS

Sridhar, A. et al, "3D-ICE: Fast Compact Transient Thermal Modeling for 3D ICs with Inter-tier Liquid Cooling", 2010 IEEE/ACM International Conference on Computer-Aided Design (ICCAD), Nov. 7-11, 2010, pp. 463-470, IEEE, San Jose, CA, USA.
Xie, J. et al., "Electrical-Thermal Co-Simulation of 3D Integrated Systems With Micro-Fluidic Cooling and Joule Heating Effects", IEEE Transactions on Components, Packaging and Manufacturing Technology, Jan. 24, 2011, pp. 234-246, vol. 1, Issue 2, IEEE, USA.
Feng, Z. et al., "Fast Thermal Analysis on GPU for 3D-ICs With Integrated Microchannel Cooling", 2010 IEEE/ACM International Conference on Computer-Aided Design (ICCAD), Nov. 7-11, 2010, pp. 551-555, IEEE, San Jose, CA, USA.
Shi, B. et al., "Optimized Micro-Channel Design for Stacked 3D-ICs", IEEE Transactions on Computer-Aided Design of Integrated Circuits and Systems, Jan. 2014, pp. 90-100, vol. 33, Issue 1, IEEE Council on Electronic Design Automation, USA.

\* cited by examiner

CONTROL SYSTEM AND ARCHITECTURE FOR INCORPORATING MICROELECTROMECHANICAL (MEM) SWITCHES IN FLUID-BASED COOLING OF 3D INTEGRATED CIRCUITS

BACKGROUND

Two-dimensional (2D) ICs have long been known to offer limited amount of bandwidth that can be delivered to a processor. For example, for data intensive workloads such as key-value stores, and distributed graph analytics, the workload's working set is often too big to fit in the central processing unit (CPU) caches. As a result, off-chip memory bandwidth largely dictates the speed of the computation. However, due to their planar design, heat dissipation for 2D ICs is simplified.

Two-and-one-half (2.5D) and three-dimensional (3D) ICs are composed of multiple die-bonded layers. In this case, memory bandwidth, for example, can be sizably increased at significantly reduced energy cost. However, one of the principal challenges is that heat generated in the hot components of one layer heats up the layers directly above and/or below it. This transference of heat makes 3D design challenging because it limits the types of circuits that can be stacked on top of one another. For instance, when considering a processor-in-memory architecture, where the 3D memory is directly stacked on top of a separate logic-layer die, the ideal operating temperatures for the memory technology limit what kind of logic can be incorporated in the logic layer. For instance, the complexity of the logic in a 3D design can be severely curtailed by the challenge that a hot arithmetic logic unit (ALU) in a logic layer of the 3D IC has the potential to corrupt the bits in dynamic random-access memory (DRAM) layers that are stacked above it, which necessitates increasing the refresh rate of the DRAM.

Accordingly, in terms of heat dissipation for 2.5D and 3D ICs, the common practice is to mount an air-cooled heatsink on the IC, have liquid cooled loops, or to immerse the IC in an electrically insulating, non-conductive liquid such as mineral oil. For example, recent trends in data centers make use of liquid cooling of servers as well as full-server immersion in a non-conductive fluid such as mineral oil in order to dissipate heat. Although liquid cooling allows for all components within a server chassis to be cooled as the fluid passes over, it does not provide the pinpoint accuracy needed to choreograph dispersion of heat at the scales that can be present in 3D die-stacked chips.

BRIEF DESCRIPTION OF THE DRAWINGS

A more detailed understanding can be had from the following description, given by way of example in conjunction with the accompanying drawings wherein.

DETAILED DESCRIPTION

Figure 1:
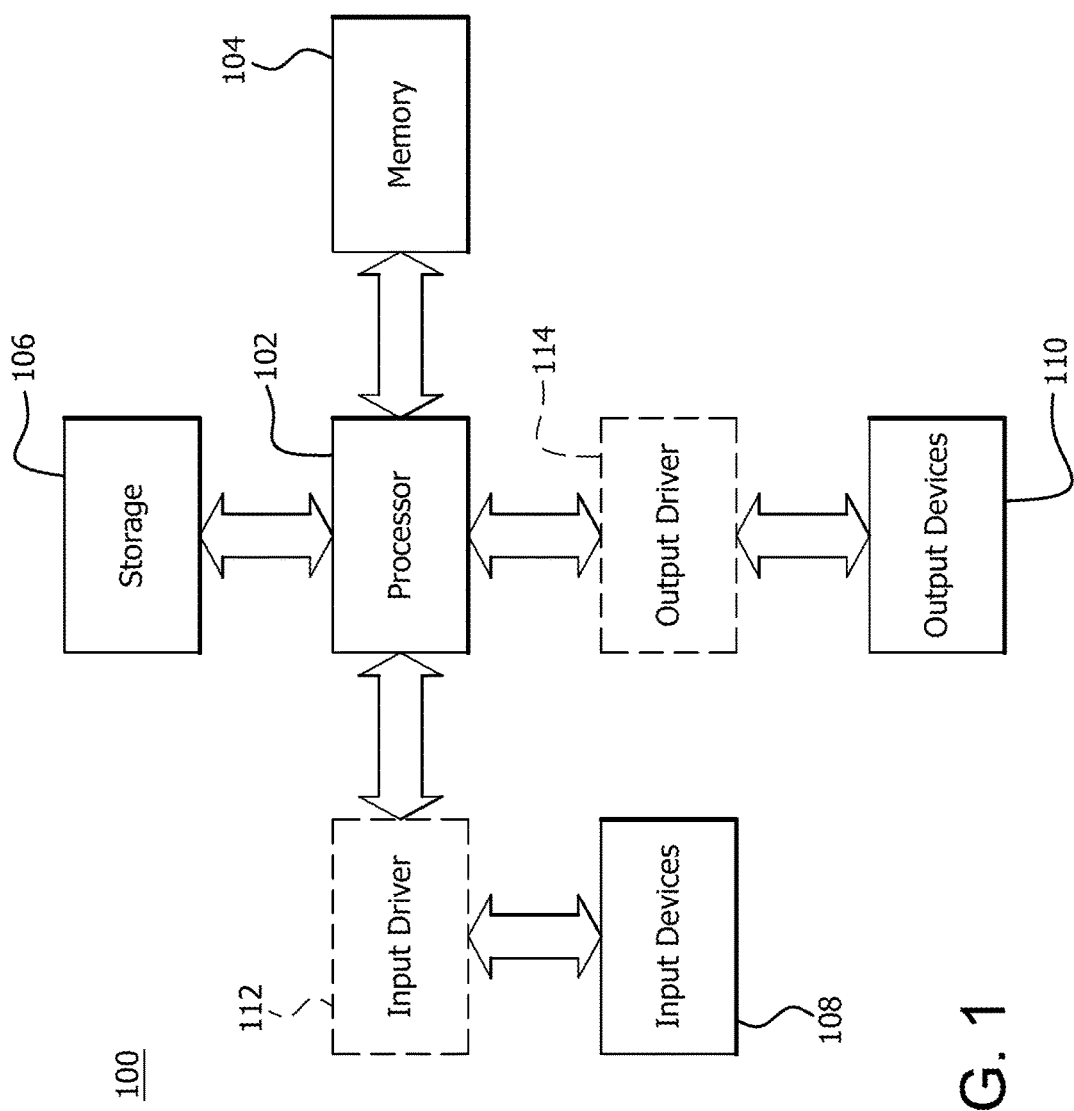
FIG. 1 is a block diagram of an example device in which one or more disclosed embodiments can be implemented.

In the following description, details are set forth to provide a more thorough explanation of embodiments provided herein. However, it will be apparent to those skilled in the art that the embodiments can be practiced without these specific details. In other instances, well-known structures and devices are shown in block diagram form rather than in detail in order to avoid obscuring the embodiments. In addition, features of the different embodiments described hereinafter can be combined with each other, unless specifically noted otherwise.

Equal or equivalent elements or elements with equal or equivalent functionality are denoted in the following description by equal or equivalent reference numerals even if occurring in different figures.

A temperature regulating system for three-dimensional (3D) integrated circuits (ICs) is provided. In particular, the temperature regulating system is provided for a complex networked system of microfluidic channels that crisscross within a 3D IC in the x, y, and z dimensions to deliver fluid to interior regions of the IC as a means to dissipate heat or otherwise regulate temperature.

An IC includes a plurality of channels configured to carry a fluid therein through internal portions of the IC. The plurality of channels include a first channel and a second channel. At least one sensor configured is provided to sense at least one state of the IC. A microelectromechanical system (MEMS)-based device is disposed at a junction connecting at least the first channel and the second channel of the plurality of channels. The MEMS-based device is configured to receive control signals from a controller based on the at least one state of the IC and is configured to regulate a flow of the fluid from the first channel to the second channel based on the control signals.

Another IC includes a first sensor configured to measure a state of the IC at a first location of the IC. The IC further includes a microfluidic network of channels configured to carry a fluid therein through internal portions of the IC The microfluidic network of channels include a first channel that is disposed in proximity to the first location such that a temperature at the first location is regulated by a flow of the fluid in the first channel. A microelectromechanical system (MEMS)-based device is disposed within the microfluidic network of channels. The MEMS-based device is configured to receive control signals from a controller based on the state of the IC at the first location, and to regulate the flow of the fluid in the first channel based on the control signals.

A method of cooling an IC is provided in which the IC includes a microfluidic network of channels, at least one sensor and at least one microelectromechanical system (MEMS)-based device disposed within the microfluidic network of channels and configured to regulate a flow of fluid within the microfluidic network of channels. The method includes monitoring, by the at least one sensor, a state of the IC. The method further includes receiving, by the at least one MEMS-based device, control signals from a controller based on the state of the IC. The method further includes regulating, by the at least one MEMS-based device, the flow of fluid within the microfluidic network of channels based on the control signals received by the at least one MEMS-based device on a real-time basis based on changes detected in the state of the IC.

FIG. 1 is a block diagram of an example device 100 in which one or more disclosed embodiments can be implemented. The device 100 can be implemented in a temperature regulating system or in a controller configured to route fluid in a networked system of microfluidic channels that crisscross within a 3D IC in the x, y, and z dimensions to deliver fluid to interior regions of the IC as a means to dissipate heat or otherwise regulate temperature. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

The processor 102 can include a central processing unit (CPU), a graphics processing unit (GPU), a CPU and GPU located on the same die, or one or more processor cores, wherein each processor core can be a CPU or a GPU. The memory 104 can be located on the same die as the processor 102, or can be located separately from the processor 102. The memory 104 can include a volatile or non-volatile memory, for example, random access memory (RAM), dynamic RAM, or a cache.

The storage 106 can include a fixed or removable storage, for example, a hard disk drive, a solid state drive, an optical disk, or a flash drive. The input devices 108 can include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 can include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

An integration of a control system and architecture is proposed for a complex networked system of microfluidic channels that crisscross a 3D IC in the x, y, and z dimensions of the IC to deliver fluid to interior regions of the IC as a means to dissipate heat. As used herein, the term "fluid" refers to any type of matter or substance that continually deforms (flows) under an applied shear stress, including liquids, gases, plasmas and the like. The control system (e.g., a controller) utilizes modeled and measured temperatures of both the fluid and the IC (e.g., components, parts and/or areas of the IC) to determine how to dynamically route the fluid through the IC via the microfluidic channels given the constraints of the "ideal" and "tolerable" operating conditions for sub-circuits within the IC. The controller is provided on the same IC it is monitoring or on a different IC.

Temperature, pressure, activity and/or power sensors are provided at one or more components of the IC and/or at different internal or external regions of the IC such that temperatures can be monitored and detected by the control system. Temperatures are either explicitly measured or estimated via one or more temperature, pressure, activity and/or power sensors. A sensor is configured to sense, measure and/or detect one or more states of the IC at one or more locations, and report the information to a controller. A state of the IC can be representative of a temperature of the IC, a component of the IC, or region of the IC, and can be associated with a specific location within the IC.

For example, a temperature sensor measures in real-time the temperature in the proximity of the sensor, and provides a temperature measurement to the controller. The temperature sensors provide temperature information in the form of temperature feedback information (e.g., measurement signals) to the control system such that the control system can determine how to dynamically route the fluid through the IC via the microfluidic channels given the constraints of the "ideal" and "tolerable" operating conditions for sub-circuits within the IC.

A pressure sensor measures in real time a pressure of a fluid flowing through a channel. A pressure sensor is used independently or in tandem with a temperature sensor and/or other sensors and models to ensure that the IC is within the target operating regime. In one aspect, a pressure sensor is used to measure the rate of flow of fluid through the IC as well to detect a malfunction in other components and to compensate accordingly. For instance, if one of the other sensors or components is malfunctioning or "noisy", and the pressure sensors can be used to correct for this irregularity or dial down (i.e., reduce) the aggressiveness of the power management regime. Thus, inconsistencies in measurements the different sensors are measuring or in values the models project can be reduced.

A power sensor measures or detects in real-time the power consumption of a component within the IC, which can also be correlated to a temperature value. The measured or detected power consumption is used by the sensor or the controller to calculate, for example, a temperature of the component such that the control system determines how to dynamically route the fluid through the IC via the microfluidic channels given the constraints of the "ideal" and "tolerable" operating conditions for sub-circuits within the IC.

In some aspects, one or more sensors (e.g., temperature or pressure sensors) are provided within or adjacent to one or more channels to measure a characteristic (e.g., temperature or pressure) of the fluid therein.

Microelectromechanical System (MEMS)-based switches are provided within the microfluidic channel network (e.g., within a channel, between channels, at a channel intersection, or collectively at a channel junction) and are configured to open and close to permit or prevent full or partial flow of the fluid through a channel, an intersection, or an area of the IC based on control commands received from the control system. Thus, the flow/flows of one or more fluids are regulated by one or more MEMS-based switches based on control signals received from the control system. Furthermore, a fluid flowing through the MEMS-based switch is routed or rerouted from one channel to a same or different channel within the microfluidic channel network by the MEMS-based switch. By routing and rerouting fluid within the microfluidic channel network, different parts of the IC can be targeted for cooling.

In one aspect, the flow/flows of one or more fluids are increased in one or more channels via control of one or more MEMS-based switches when a condition is satisfied (e.g., when temperature state, a power state, or an operational state satisfies a first condition). In addition or alternately, flow/flows of one or more fluids are maintained in a base state, decreased or stopped in one or more channels via control of one or more MEMS-based switches when the first condition is not satisfied or when a second condition is satisfied.

For example, the first condition is whether an upper threshold, corresponding to a temperature state, a power state, or an operational state (e.g., high temperature state, high power state, or high operational state), is met or exceeded (i.e., above the upper threshold), and the second condition is whether a lower threshold, corresponding to a temperature state, a power state, or an operational state (e.g., low temperature state, low power state, or low operational state), is met or exceeded (i.e., below the lower threshold).

It will be understood that one or more conditions, thresholds and/or targets have equal, lesser or higher priority that should, could or need to be met and many different operating regimes that are used to control one or more MEMS-based switch throughout the system for controlling the flow of fluid. For example, a component of higher priority receives priority in cooling via the regulation of fluid in a nearby channel over a component of lesser priority. In addition or in the alternative, a first component of equal priority receives priority in cooling via the regulation of fluid in a nearby channel over a second component of equal priority based on a critical target (e.g., temperature or power threshold) being met or exceeded by the first component.

As used herein, a "priority in cooling" refers to a routing of fluid or of more fluid to a channel in proximity to an area of the IC when compared to an amount of fluid routed to a channel in proximity to another area of the IC. Thus, in one or more aspects, the IC is divided into different areas that do or do not overlap. An "area of the IC" is a region, area, part and/or component of the IC and each region, area, part and/or component of the IC are assigned a priority level which are the same or different than other priority levels for managing the regulation of fluid passing through different areas of the IC via the channel network. Furthermore, one or more regions, areas, parts and/or components are measured by a sensor, and, thus, one or more sensors could also be assigned a priority level that is correlated to the area of the IC the sensor is measuring.

It will be understood that the terms gate, switch, valve, MEMS switch, MEMS-based switch, MEMS gate and MEMS-based gate are used interchangeably, unless specifically noted otherwise, and that one term can replace or be combined with another term in one or more aspects. These terms can generally be referred to as MEMS, MEMS-based devices, aperture regulating mechanisms, port regulating mechanisms, opening regulating mechanisms, ingress control mechanisms, egress control mechanisms, fluid flow control mechanisms and the like, or can include one or more aperture regulating mechanisms, port regulating mechanisms, port opening/closing mechanisms, ingress control mechanisms, egress control mechanisms, fluid flow control mechanisms and the like.

In one or more aspects, one or more types of fluid are used and/or mixed to control and optimize heat dissipation. The different fluids each have different thermal absorption properties and/or different levels of compressibility. For example, a first fluid is used in a channel or throughout the channel network under normal temperature conditions, and a second fluid with a higher thermal absorption or compressibility is injected or volume increased upon detection by the control system of a temperature of a components, parts and/or area of the IC that exceeds a threshold. In one aspect, the first fluid is replaced by the second fluid by the control of valves, gates, and/or MEMS-based switches. In another aspect the first fluid is supplemented (i.e., mixed) with the second fluid by the control of valves, gates, and/or MEMS-based switches. A concentration of the mixture can also be monitored by a sensor and/or the controller and controlled based on the control of the valves, gates, and switches.

The control system provides dynamic control of the MEMS-based switches by actively and continuously monitoring and modifying the state (e.g., opened state, closed state, and any degree therebetween) of MEMS-based switches to control the rate of ingress and egress of fluid between the input and output channels of the IC, as well as the degree of mixing of fluid of distinct temperatures from points of ingress to points of egress. This technique allows for sub-circuits, such as ALUs, to operate at peak performance for longer periods without having to be as aggressively throttled using dynamic voltage and frequency scaling (DVFS). Accordingly, the dynamic control of the fluid throughout the microfluidic channel network provides pinpoint accuracy of the dispersion of heat throughout the IC based on a current environment or condition, and addresses the dispersion of heat at a component level within the IC.

In one or more aspects, internal and/or external pumps are further provided for circulating the fluid through the IC. For example, one or more external pumps are provided to inject fluid into one or more channels or withdraw fluid from one or more channels. In addition or in the alternative, one or more internal pumps are provided within the microfluidic channel network to do the same. In one or more aspects, one or more MEMS-based switches include a pump. The pumps further help to control the rate of ingress and egress of fluid between the input and output channels of the IC, as well as the degree of mixing of fluid of distinct temperatures from points of ingress to points of egress.

It will be appreciated that the integrated control system architecture is applicable to microfluidic cooling either in conjunction with full immersion system or as a standalone cooling solutions. A standalone cooling solution includes a separate cooling method for the full system. For example, some standalone techniques include regular air-cooling or liquid cooling in which the cooling liquid is stored in a reservoir or tank and provided to the channels by injection or pumping. The liquid (or other fluid) is further cooled after passing through the IC and recycled in a closed system.

Dynamic control of the fluid throughout the microfluidic channel network reduces the heat transfer problem created by 3D stacking by allowing fluid to be directly routed to the parts of the IC that are in most need of it, when they need it. For example, this technology when utilized with full server immersion system or a separate, standalone microfluidic heat dissipation system more effectively dissipates heat from the hottest components, which can be used to create commercially differentiated processors with more aggressive designs (e.g., feasibly stacking last level cache (LLC) on top of the processor) and operating points.

More effective use of microfluidic cooling is achieved through active control of fluid flow based on dynamically determined requirements. Therefore, higher energy density can be tolerated, allowing various circuits to be located more densely. By bringing communicating components closer together, wire length, and hence resistance, is decreased, which saves energy. In addition, higher bandwidth between components can be achieved at reduced energy cost, which could be essential for a number of important data center workloads that do not cache well.

Allowing for pinpoint control of heat dissipation grants the power management subsystem a further degree of freedom in the form of fluid routing over the traditional techniques of DVFS and power gating. Such control enables more aggressive chip designs in the data center space, with higher performance per watt.

Figure 2:
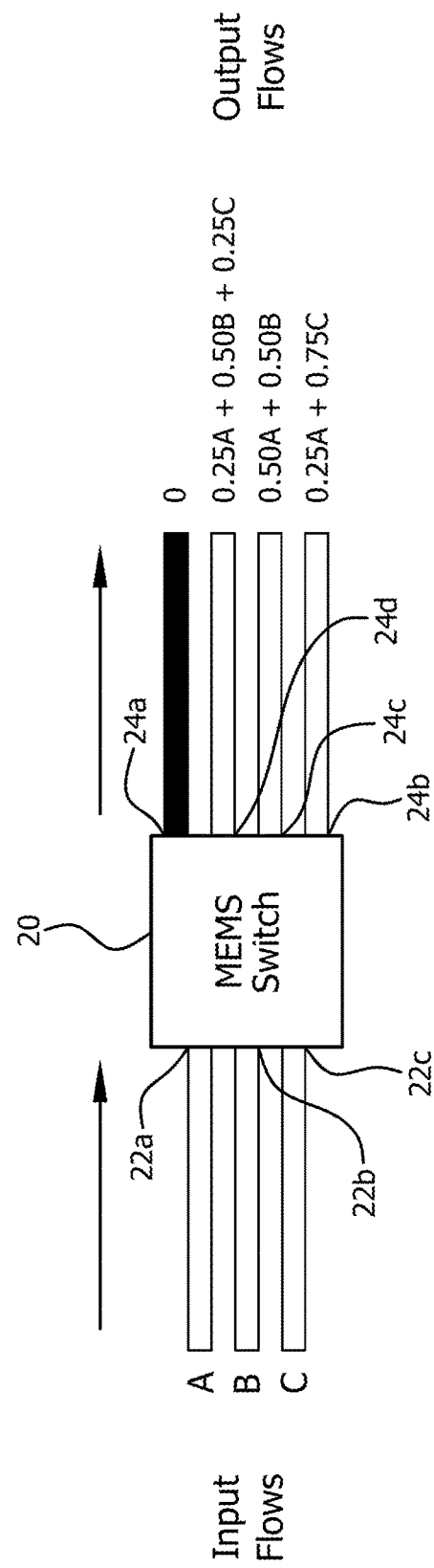
FIG. 2 illustrates an example MEMS-based switch according to one or more disclosed embodiments.

FIG. 2 illustrates an example MEMS-based switch 20 according to one or more embodiments. The switch 20 includes multiple input ports 22a, 22b and 22c, multiple output ports 24a, 24b, 24c and 24d, and one or more internal pathways or channels (not shown) therebetween. One or more fluids A, B and C flow into the switch 20 through the input ports 22a, 22b and 22c and flow out of the switch 20 through the output ports 24a, 24b, 24c and 24d. Fluids A, B and C of potentially different pressures and temperatures are mixed in differing quantities or volumes when routed through the switch 20 to the output ports 24a, 24b, 24c and 24d. Thus, the switch 20 is configured with multiple internal intersecting channels and gates for mixing one or more fluids A, B and C. For example, the output flow for output port 24a is closed such that no fluid flows out of output port 24a. The fluid in output flow for output port 24b is a combination of 0.25A, 0.50B and 0.25C, the fluid in output flow for output port 24c is a combination of 0.50A and 0.50B, and the fluid in output flow for output port 24d is a combination of 0.25A and 0.75C.

Figure 3:
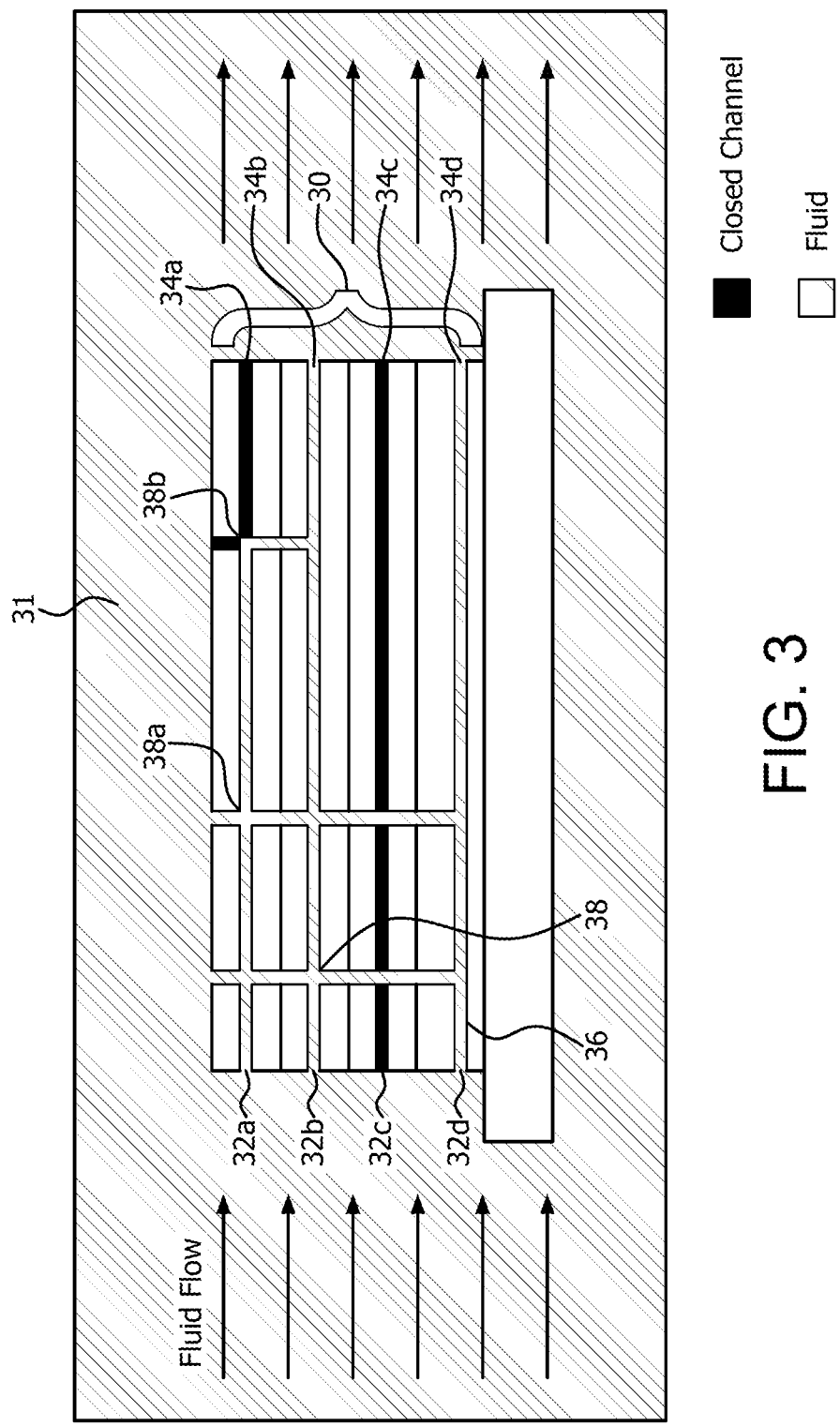
FIG. 3 illustrates an example 3D IC with a microfluidic channel network according to one or more disclosed embodiments.

FIG. 3 illustrates an example 3D IC 30 with a microfluidic channel network according to one or more disclosed embodiments. It will be understood that the terms IC and chip are used interchangeably throughout. The IC 30 is immersed in fluid 31 (i.e., immersive fluid) such that the fluid 31 flows from one or more input ports 32a, 32b, 32c and 32d of the IC 30 to the one or more output ports 34a, 34b, 34c and 34d of the IC 30 through one or more channels of a microfluidic channel network 36 of the IC 30. Each input port 32a, 32b, 32c and 32d and output port 34a, 34b, 34c and 34d is provided with a MEMS-based switch or gate controlled by the control system for controlling the ingress and egress of the fluid 31 into and from the IC 30. For example, MEMS-based switches or gates provided at input port 32c and output ports 34a and 34c are closed, while MEMS-based switches or gates provided at input ports 32a, 32b and 32d and output ports 34b and 34d are open or at least partially open.

External pumps (not shown) can also be provided to inject the fluid 31 into the IC 30 or withdraw the fluid 31 from the IC. It will be appreciated that the IC 30 can also be implemented with a standalone cooling solution (e.g., a separate microfluidic heat dissipation system). In such a system, the IC 30 is not be immersed in the fluid 31 and external pumps (not shown) are provided to inject the one or more fluids (e.g., fluids A, B and C) into the IC 30 or withdraw the fluid 31 from the IC.

The channel network 36 traverses one or more layers of the IC 30 and includes multiple channel intersections 38 (e.g., intersection 38a and intersection 38b) where a MEMS-based switch (e.g., switch 20 described in FIG. 2) is provided. It will be appreciated that a MEMS-based switch is provided at some, none or all channel intersections 38, and/or that one or more MEMS-based switches is provided in one or more channels of the channel network 36.

As shown in FIG. 3, the state of each of the MEMS-based switches is dynamically controlled by a control system (e.g., a controller) based on sensed temperature conditions within the IC 30. The states of the MEMS-based switches and their respective input/output ports are configured by the controller on a real-time basis to be in an open state, closed state or a partially closed/open state based on the control of the controller. For example, the MEMS-based switch at channel intersection 38a has each of its input/output ports at least partially open such that fluid enters and exits each channel connected thereto. On the other hand, the MEMS-based switch at channel intersection 38b has two of its input/output ports closed such that fluid does not flow within two of the channels connected thereto. The MEMS-based switches can be controlled independently or in cooperation with each other based on the determined flow of the fluid that the controller implements.

In one or more aspects, in addition to or in alternative to reactive based cooling, the control system for the MEMS switches described above co-operates with power distribution control of the chip such that the necessary cooling is proactively provisioned based on measurements and models. For example, when a processor core enters a "boosted" or "turbo" state, cooling near that core is increased proactively using the MEMS switch infrastructure. Thus, the state of one or more MEMS-based switch is controlled based on an operational state of a component within the IC 30 such that fluid flowing near the component is controlled to effectively dissipate heat generated by the component in a proactive manner.

Figure 4:
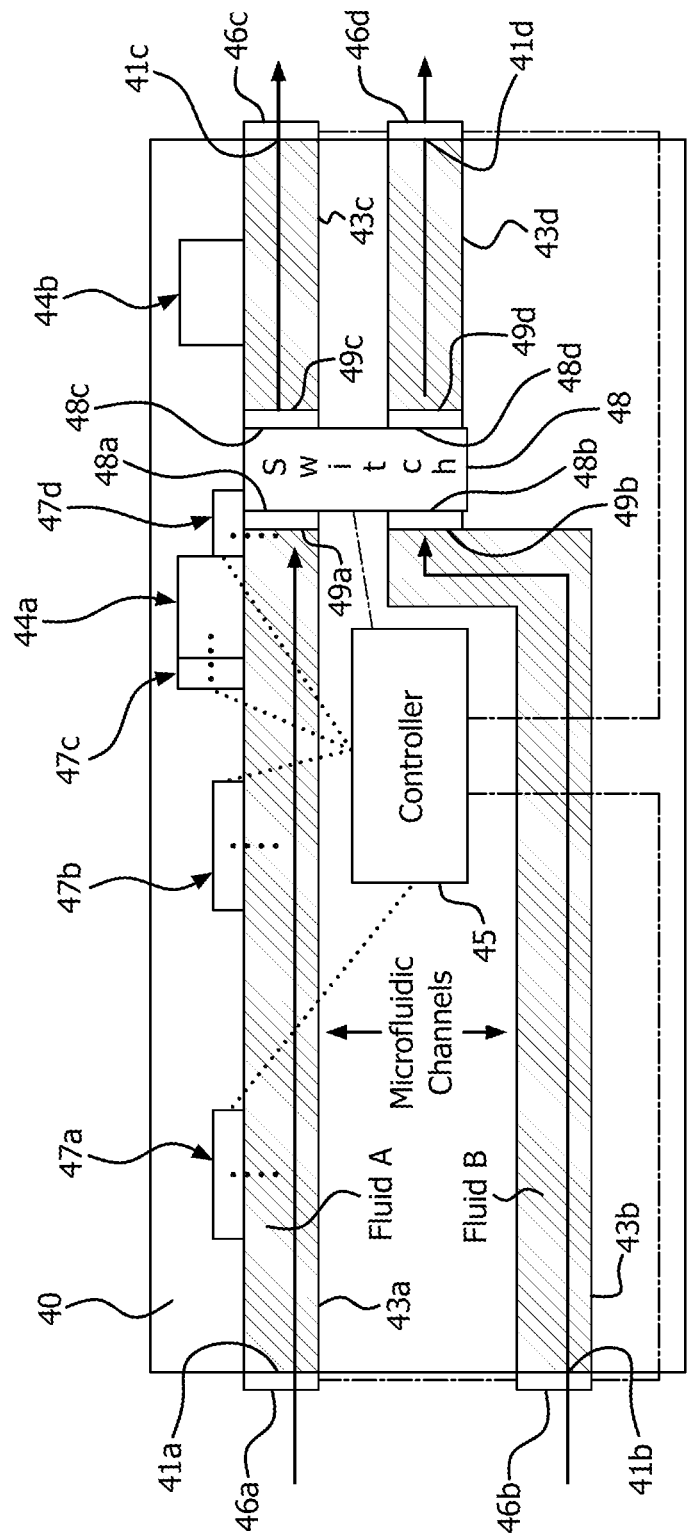
FIG. 4 illustrates another example 3D IC with a microfluidic channel network according to one or more disclosed embodiments.

FIG. 4 illustrates another example 3D IC 40 with a microfluidic channel network according to one or more disclosed embodiments. The IC 40 is or is not be immersed in a fluid. The 3D IC 40 includes input ports 41a and 41b (i.e., ingress ports) and output ports 41c and 41d (i.e., egress ports) and microfluidic channels 43a, 43b, 43c and 43d therebetween for carrying one or more fluids (e.g., fluid A and fluid B) therein. The channels 43a, 43b, 43c and 43d are of the same or of differing widths.

The 3D IC 40 further includes IC components 44a and 44b that are located adjacent to channels 43a and 43c, respectively. However, it will be appreciated that the location of IC components and channels are not limited thereto. For example, each or fewer channels have an IC component adjacent thereto or in proximity therewith. A channel can be adjacent to or in proximity to more than one IC component, which can be located on same or opposing sides of the channel. An IC component can also have more than one channel located adjacent thereto or in proximity therewith. Furthermore, while FIG. 4 illustrates channels in the x-y plane, channels can also extend in the z-plane. Thus, a channel adjacent or in proximity to a component can be a channel that extends in the x-direction, the y-direction, the z-direction or a combination thereof.

An IC component is any component within or on a surface of the IC 40 that generates heat due to being in an operational state. The 3D IC 40 further includes a controller 45 electrically coupled to (i.e., in electrical communication with) gates 46a, 46b, 46c and 46d, sensors 47a, 47b, 47c and 47d, and a switch 48 that includes input ports 48a and 48b (i.e., ingress ports) and output ports 48c and 48d (i.e., egress ports) with additional gates 49a, 49b, 49c and 49d coupled thereto or integrated therein. Furthermore, gates 46a, 46b, 46c and 46d can each be part of a MEMS gate or switch.

The microfluidic channels 43a, 43b, 43c and 43d carry one or more fluids therein (e.g., fluid A and fluid B). For example, fluids A and B are the same type of fluid having a same temperature or having differing temperatures. For example, the fluid A in channel 43a, which runs along or traverses various sensors and IC components, is typically warmer than the fluid B in channel 43b, which runs along none or fewer IC sensors and IC components. Thus, fluid A, when mixed with fluid B within the switch 48, is used to cool down fluid B. Alternatively, fluids A and B are different such that channel 43a carries a first type of fluid A and channel 43b carries a second type of fluid B different than the first type. Thus, the fluids A and B can be mixed by the switch 48 to regulate the properties of the mixed fluid exiting the switch 48 into channels 43c and/or 43d. For instance, the switch 48 in FIG. 4 routes a disproportionate amount of a cool liquid (e.g., fluid B) from the lower channel 43b to the upper egress port 41c via upper channel 43c in order to be able to better cool the second component 44b. This is achieved, for example, by narrowing the apertures of gates 49a and 49d and widening the apertures of gates 49b and 49c such that the fluid pressure forces a disproportionate amount of a cool liquid (e.g., fluid B) from the lower channel 43b to the upper egress port 41c via upper channel 43c.

The switch 48 is a multichannel MEMS-based switch and includes one or more internal channels, one or more internal gates and one or more pumps which are configured to regulate the flow and the route of fluids A and B and, furthermore, enable the mixing of fluids A and B. The internal channels can intersect with one another. The opened, partially opened or closed state (i.e., the opening width) of the gates 49a, 49b, 49c and 49d and internal gates (not shown) are controlled by the controller 45 to regulate the temperature of the components 44a and 44b.

For example, all or part of fluid A from channel 43a and none of fluid B from channel 43b is directed by switch 48 to channel 43c, and all or part of fluid B from channel 43b and none of fluid A from channel 43a is directed by switch 48 to channel 43d. Alternatively, all or part of fluid A from channel 43a and none of fluid B from channel 43b are directed by switch 48 to channel 43d, and all or part of fluid B from channel 43b and none of fluid A from channel 43a are directed by switch 48 to channel 43c. Additionally or alternatively, fluids A and B are at least partially mixed within the switch 48 such that a mixture of fluids A and B is directed to channel 43c and/or channel 43d. It will be appreciated that any mixture or non-mixture of fluids A and B is provided by the switch 48 to channels 43c and 43d based on the control signals provided by the controller 45 to the switch 48. The control signals are generated by the controller 45 based on a temperature, explicit or implicit, of the corresponding fluid, area, IC component, region, or other monitored part of the IC 40 such that a temperature of the IC 40 is regulated, and, more particularly, such that an internal temperature of the IC 40 is regulated.

Sensors 47a, 47b, 47c and 47d are one of temperature, pressure, activity or power sensors, as similarly described above, and provide measurement feedback information (i.e., measurement data) to the controller 45. The sensors 47a, 47b, 47c and 47d output raw measurement data (i.e., sensed data) or processed measurement data. For example, for outputting processed measurement data, a sensor includes one or more processors for processing the raw measurement data and outputting processed measurement data. Thus, the sensors 47a, 47b, 47c and 47d are configured to sense, detect and/or measure a state of the IC 40 such that the state of the IC 40 is representative of a temperature of the IC 40, a component of the IC 40 or region of the IC 40.

The controller 45 is configured to collect and process the received measurement feedback information (raw or processed) to instruct, via control signals, any of gates 46a, 46b, 46c, 46d, 49a, 49b, 49c and 49d, and internal gates (not shown) of switch 48 for regulating the flow of fluids A and B within the channels for regulating a temperature of the IC 40. For example, the controller 45, while monitoring one or more components, sensors, areas, etc. of the IC 40, detects or determines that a temperature in the IC 40 has exceeded or is likely to exceed a threshold, and the controller 45 configures one or more MEMS-based devices via control signals such that fluid, additional fluid and/or cool fluid is routed to at least one channel located at the region of the IC 40 that corresponds to the temperature increase.

The controller 45 includes one or more processors for receiving measurement feedback information, processing and/or analyzing the measurement feedback information, and providing control signals to one or more elements described herein. While the controller 45 is depicted as part the IC 40 in FIG. 4, the location of the controller 45 is not limited thereto and can be provided elsewhere, even on another IC.

Gates 46a, 46b, 46c and 46d are referred to as external gates or switches and gates 49a, 49b, 49c and 49d are referred to as internal gates or switches. Furthermore, it will be understood that each gate 46a, 46b, 46c, 46d, 49a, 49b, 49c and 49d, and internal gate (not shown) provided within the switch 48 can be any type of gate, valve, switch or the like (e.g., a MEMS gate, valve or switch) that can be controlled between fully open and fully closed states, and/or any degree therebetween for regulating the flow of a fluid therethrough (e.g., through a corresponding port, aperture or opening). Thus, each gate is configured with gate functionality and/or switch functionality.

For example, one or more MEMS-based devices can be or can include a MEMS gate, and provides gate functionality such that the MEMS-based devices act as gates where fluid is prevented from exiting or entering a certain part of the IC via the walling off of channels. That is the MEMS gate is either fully open or fully closed.

In addition, one or more MEMS-based devices can be or can include a MEMS switch, and provides switch functionality such that the MEMS-based device acts as switch for a single channel or a multichannel junction (i.e., single channel switch and multichannel switch). A single channel switch controls the rate of flow of fluid through a single channel by modulating the minimum width of the channel opening or aperture. A multichannel switch modulates the minimum width of one or more channel openings or apertures, and can also control the mixing of fluids of different temperatures and/or types as well as selecting, which ports the fluid/fluids enter and exit out of.

Figure 5:
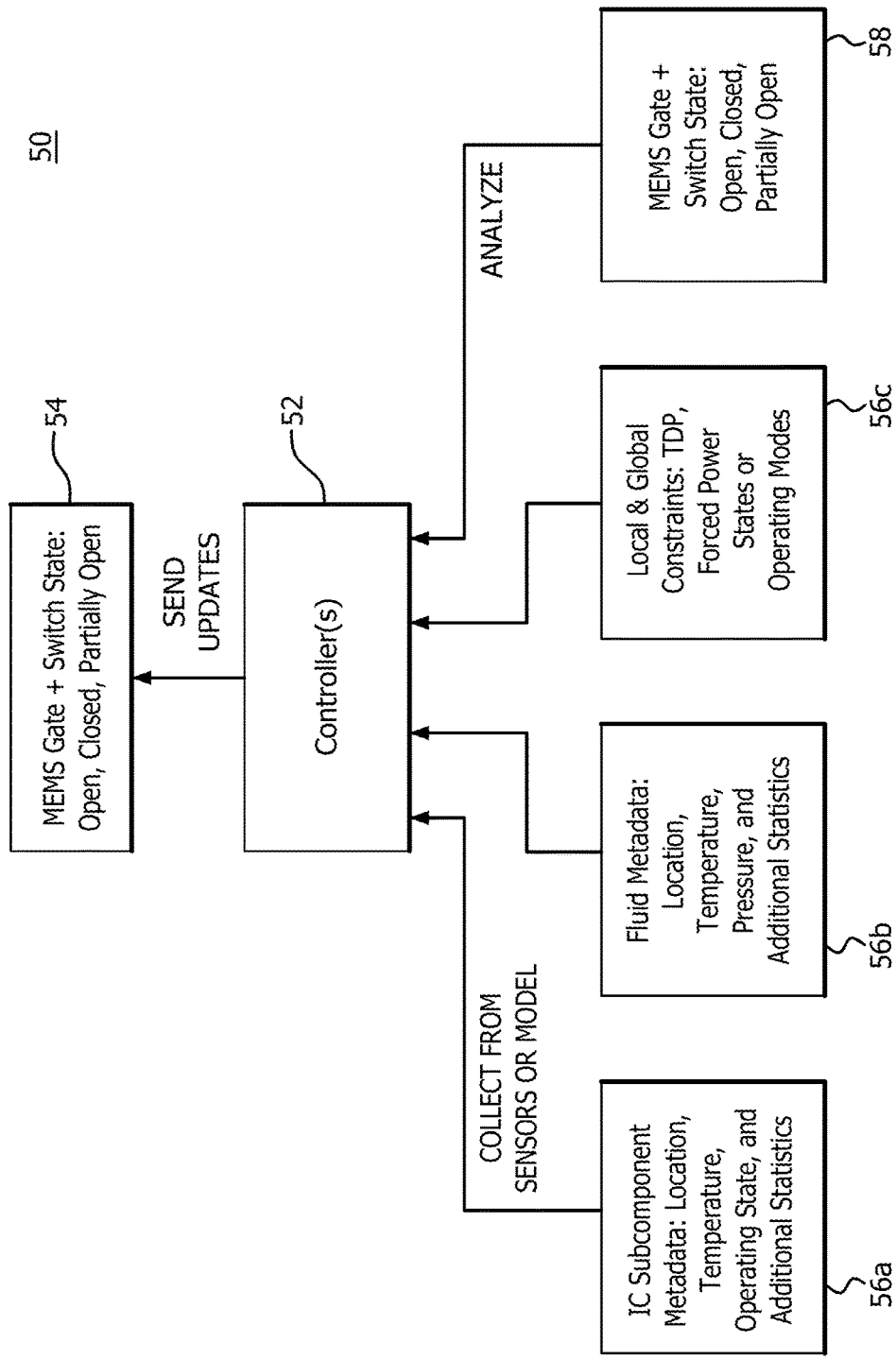
FIG. 5 illustrates a block diagram of an example control system implemented by one or more disclosed embodiments.

FIG. 5 illustrates a block diagram of an example control system 50 implemented by one or more disclosed embodiments. The control system 50 includes a controller 52 that sends updates in the form of control signals to MEMS gates and switches 54 based on data collected from one or more sensors and/or one or more models, referred to as units 56a, 56b and 56c, and based on analyzing the switch states (e.g., open, closed or partially open) of the MEMS gates and switches 58.

Unit 56a is one or more sensors and/or one or more memory devices, and provides IC subcomponent metadata for an IC component. The IC subcomponent metadata includes at least one of location, temperature, operating state and additional statistics with respect to a sensor and/or an IC component in proximity to the sensor.

Unit 56b is one or more sensors and/or one or more memory devices, and provides fluid metadata of a fluid in proximity to a sensor. The fluid metadata includes at least one of location, temperature, pressure and additional statistics with respect to a fluid and/or an IC component in proximity to the sensor.

Unit 56c is one or more memory devices storing one or more models and other data, and provides local and global constraints stored therein with respect to a particular IC component and/or the IC itself. The local and global constraints are provided and/or stored by a user (e.g., a programmer) and adapted, modified and/or updated based on the design of the IC and/or for a particular IC component. The local and global constraints can include power constraints that correspond to a maximum temperature an IC and/or an IC component is designed to withstand, and the control of fluid (e.g., timing, rate of flow, temperature, pressure, route, direction, mixing, etc.) is adapted based on such power constraints. The local and global constraints can additionally include maximum temperatures tolerable by an IC and/or an IC component based on the thermal sensitivity of the IC and/or the component. The local and global constraints can be further provided for forced power states and operating modes of the IC and/or an IC component, and the control of fluid is adapted thereto. Thus, the controller 52 is configured to control one or more fluids according to the local and global constraints of a specific IC, IC component and/or the design or implementation thereof.

The controller 52 further analyzes (e.g., receive, monitor and/or track) state information 58 of a MEMS gate or switch such that the state of the MEMS gate or switch can be controlled and configured on a real time basis according to other information collected by the controller 52.

Figure 6:
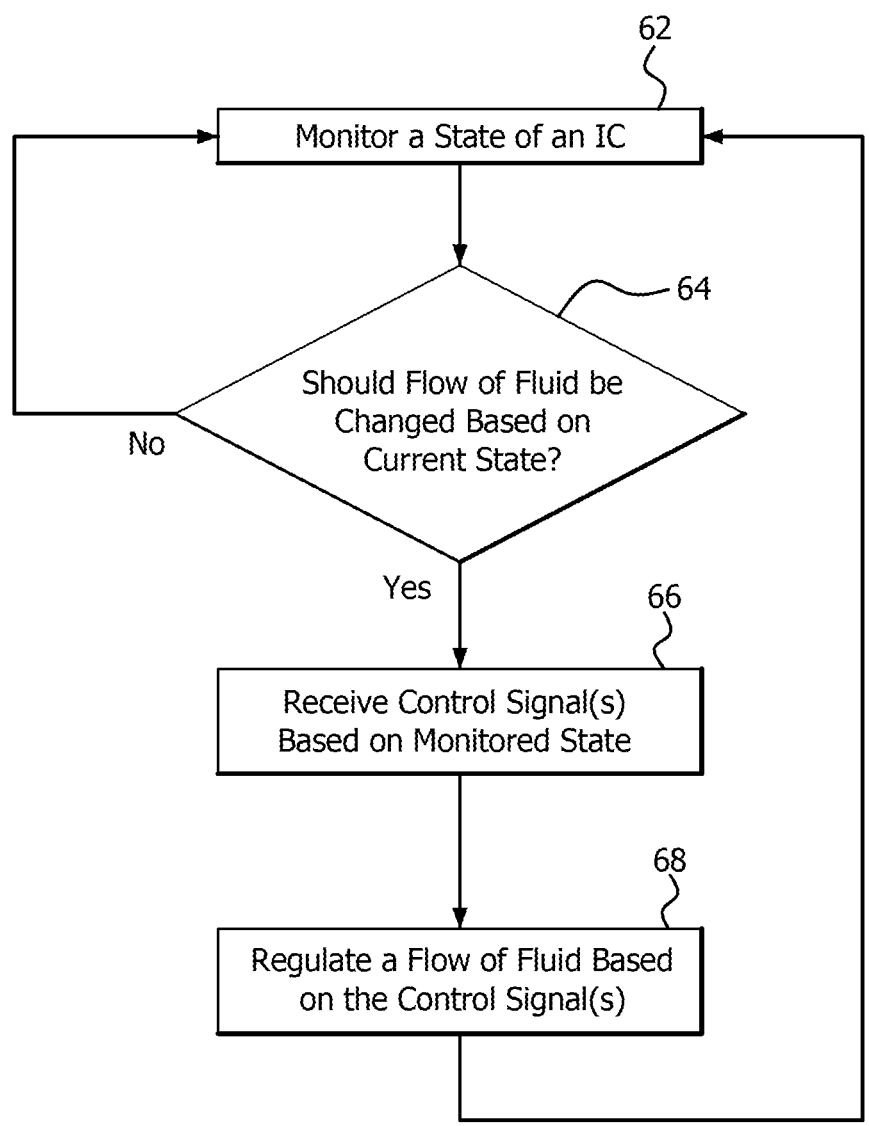
FIG. 6 is a flow diagram of a cooling method implemented by one or more disclosed embodiments.

FIG. 6 is a flow diagram of a cooling method 600 implemented by one or more disclosed embodiments. As described above, the IC includes a network of microfluidic network of channels, at least one sensor and at least one MEMS-based device disposed within the microfluidic network of channels and configured to regulate a flow of fluid within the microfluidic network of channels. Accordingly, the method 600 includes monitoring and detecting, by the at least one sensor, a state of the IC (operation 62). A controller determines whether a flow of fluid in the microfluidic network of channels should be changed based on a current state of the IC (operation 64), and returns to operation 62 if the flow of flow of fluid in the microfluidic network of channels should not be changed. If the flow of fluid in the microfluidic network of channels should be changed, the controller sends controls signals based on the state of the IC, which are received by the at least one MEMS-based device (operation 66). The at least one MEMS-based device regulates the flow of fluid within the microfluidic network of channels based on the control signals received by the at least one MEMS-based device on a real-time basis based on changes detected in the state of the IC (operation 68).

Figure 7:
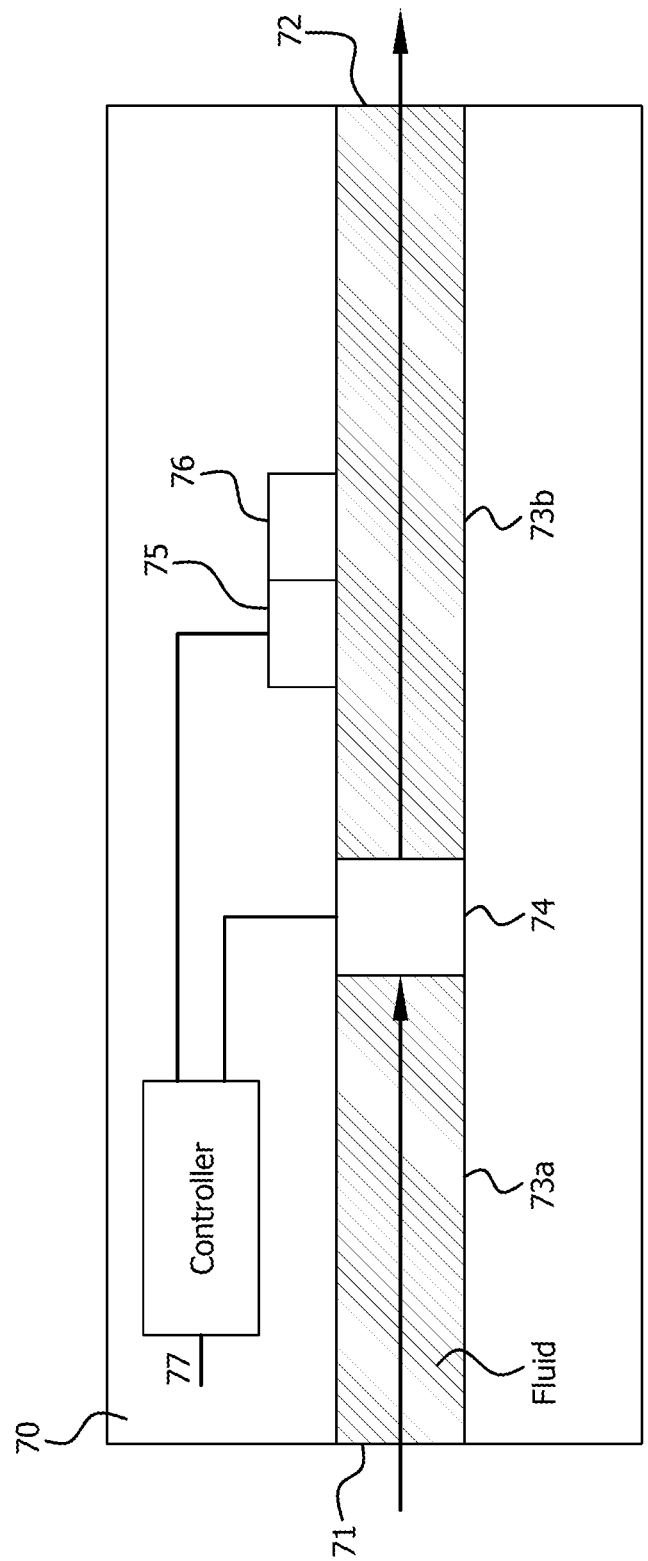
FIG. 7 illustrates another example 3D IC with a microfluidic channel network according to one or more disclosed embodiments.

FIG. 7 illustrates another example 3D IC 70 with a microfluidic channel network. The IC 70 includes an input port 71 and an output port 72 for allowing fluid to flow into and out of the IC 70. The IC 70 includes a first channel 73a and a second channel 73b for carrying the fluid therein. The first channel 73a and the second channel 73b are connected by a single channel MEMS-based device 74, which is implemented as either a gate or a switch for regulating the flow of fluid to the second channel 73b. The IC 70 further includes a sensor 75 which measures a state of the IC 70, including a state of component 76 that is adjacent to the second channel 73b. The sensor 75 transmits measurement signals to the controller 77, which controls the state of the MEMS-based device 74 to regulate the flow of fluid to the second channel 73b. In particular, the controller 77 transmits control signals to the MEMS-based device 74 to regulate the flow of fluid to the second channel 73b and to regulate the temperature in the area of the IC 70 proximate to the second channel 73b. While the controller 77 is illustrated as part of the IC 70, it will be appreciated that the controller 77 can be located on a device external to the IC 70.

In view of the above, a MEMS-based network of active switches is incorporated into a 3D IC that can dynamically modulate the flow and routing of fluid within the microfluidic channels within the 3D IC. The network of switches are controlled using active measurements provided by sensors and/or modeling of heat dissipation in various parts of the 3D IC during operation. Thus, the control system and architecture allows for dynamic microfluidic cooling of a 3D IC with pin point accuracy. Specific areas within the 3D IC are cooled on "as needed" basis with a higher degree of urgency than other areas of the 3D IC.

One or more control systems, including a controller, disclosed herein is configured to utilize any combination of data sources, including localized power and temperature statistics, activity measurements, machine specifications, and models composed thereof and/or emulating them to control the states of the individual MEMS-based switches throughout the IC. The control system can interface with the chip's other power and temperature management systems. The control system is either centralized or decentralized.

The control system, via coordinating the MEMS-based switches, controls the ingress and egress of fluid from the IC. For example, the control system controls which external MEMS-based switches (e.g., gates 46a, 46b, 46c, 46d) are open or closed, and controls the width of the aperture or port, etc., of the MEMS-based switches to control the volume of fluid flowing through the aperture or port.

The control system, via coordinating the MEMS-based switches, controls mixing of fluid of different temperatures based on the aforementioned data sources, for example, power, temperature, etc., at various points of the IC as well as the temperature of the discrete channels of fluid that mix at channel junctions governed by the switches.

The control system, via coordinating the MEMS-based switches, controls gating off parts of the IC by closing MEMS-based switches such that the fluid does not flow there (i.e., does not flow in a specific channel).

A network of MEMS-based switches throughout the IC both within the interior and at the exterior provide gate and/or switch functionalities. For example, one or more MEMS-based switches provide gate functionality such that the MEMS act as gates where fluid is prevented from exiting or entering a certain part of the IC via the walling off of channels. That is, the gate is either fully open or fully closed. As another example, one or more MEMS-based switches provide switch functionality such that the MEMS act as switches for single channels and multichannel junctions (i.e., single channel switches and multichannel switches). A single channel switch controls a rate of flow of fluid through a single channel by modulating the minimum width of the channel opening or aperture. A multichannel switch controls a rate of flow of fluid and/or the mixing of fluids of different temperatures and/or types as well as selecting, which ports the different fluids exit out of.

One or more control systems disclosed herein includes internal control and monitoring network(s) for propagating and updating switch and gate states, monitoring fluid thermals, pressures and velocity, and for interfacing with IC components/subcomponents that can direct high level policies.

Instruction set architecture extensions can be provided for querying state and expressing policies to the control system. For example, the control system is configured to query the state of each gate and switch, and transmit updates (e.g., control signals) to each gate and switch to update their state.

Instruction set architecture extensions include the addition of model specific registers for controlling MEMS switch and gate states, model specific registers for controlling high-level cooling policies on-chip, and model specific registers that can be queried and set to report the state of the switches/gates and fluid at different locations. The state of the switches and gates include information corresponding to one or more of the mixing ratios at switches, degree gates are open/closed, location, etc. The state of the fluids can include information corresponding to fluid pressures and temperatures in different channels, and heat differentials over time, location, etc.

The instruction set architecture extensions provide instructions that manipulate cooling policies, instructions to manipulate the state of MEMS switch and gate states, instructions to query MEMS switch and gate states, and instructions to query fluid temperatures, pressures, velocities throughout the IC.

It will be appreciated that decision making for controlling the state of the gates and switches by the control system can be made by software, hardware, firmware or a combination thereof.

The use of the aforementioned MEMS concepts can be further applied to an external switching system. For example, a control system (e.g., a controller) can monitor, control or receive information corresponding to separate external channels that are external to the IC that supply the fluid to the internal channels in the IC that are switched using MEMS gates and switches (e.g., for non-immersive systems or for immersive systems coupled with separate external channels). The switching and/or gating of external channels is based on at least one of internal fluid sensor data, eternal fluid sensor data, internal gate and switch states, and external gate and switch states.

The control system of the IC is external to the IC, internal to the IC, or internal to the IC and integrated with an external control system. Thus, an external or coupled internal-external control system can be provided for switching the fluid fed to the IC.

Furthermore, an IC can be part of a network of ICs that exchange information with each other and/or share fluid. For example, a chain of ICs includes at least one upstream IC and at least one downstream IC that share information such that a controller of each IC or a global controller of the network of IC can make global decisions that impact other ICs in the network. For example, a temperature state of one IC in the network of ICs can affect (or can be anticipated to affect) a temperature state of one or more other ICs in the network, and/or the temperature of the fluid delivered to a downstream IC. Thus, global decisions can be made by the control system for the network of ICs such that internal switches and gates of individual ICs are controlled such that heat is dissipated effectively on an individual and/or global scale. Accordingly, one or more ICs in the network of ICs can be configured to transmit any of the internal or external switch, gate, or controller states in digital form to another IC over any medium. In addition, interfaces can be provided between internal to external control and monitoring networks for controlling and/or coordinating switch and gate states and for integrating and/or coordinating temperature and pressure sensors.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements aspects of the embodiments.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. An integrated circuit (IC) comprising:
a plurality of channels configured to carry fluids therein through internal portions of the IC, wherein the plurality of channels include a first channel that carries a first fluid and a second channel that carries a second fluid;
at least one sensor configured to sense at least one state of the IC; and
a microelectromechanical system (MEMS)-based device disposed at a junction connecting at least the first channel and the second channel of the plurality of channels, wherein the MEMS-based device is configured to control a temperature of the IC by:
receiving control signals from a controller based on the at least one state of the IC; and
regulating a mixing of the first fluid and the second fluid to form a mixed fluid based on the control signals.

2. The IC of claim 1, wherein:
the MEMS-based device includes a plurality of ingress ports and at least one egress port,
the plurality of ingress ports provide the first fluid at a first temperature and the second fluid at a second temperature,
and the MEMS-based device is configured to regulate the mixing of the first fluid and the second fluid to obtain a desired temperature of a flow of the mixed fluid from the at least one egress port based on the control signals.

3. The IC of claim 1, further comprising:
an ingress IC port configured to allow the mixed fluid to flow into the IC;
an egress IC port configured to allow the mixed fluid to flow out of the IC;
an ingress MEMS-based device disposed at the ingress IC port and configured to regulate a flow of the mixed fluid into the IC based on the at least one state of the IC; and an egress MEMS-based device disposed at the egress IC port and configured to regulate a flow of the mixed fluid out of the IC based on the at least one state of the IC.

4. The IC of claim 1, wherein the at least one state of the IC is associated with a temperature at a location within the IC, and the MEMS-based device is configured to regulate a flow of the mixed fluid such that the temperature is regulated on a real-time basis.

5. The IC of claim 1, further comprising:
the controller configured to receive measurement information from the at least one sensor that corresponds to the at least one state of the IC, and generate the control signals based on the measurement information.

6. The IC of claim 1, wherein the MEMS-based device is configured to be switched between a closed state and an open state based on the control signals for regulating a flow of the mixed fluid.

7. The IC of claim 1, wherein the MEMS-based device includes at least one pump that regulates a flow of the mixed fluid based on the control signals.

8. An integrated circuit (IC) comprising:
a first sensor configured to measure a state of the IC at a first location of the IC;
a microfluidic network of channels configured to carry a fluid therein through internal portions of the IC, wherein the microfluidic network of channels include a first channel that carries a first fluid, second channel that carries a second fluid and a third channel that is disposed in proximity to the first location; and
a first microelectromechanical system (MEMS)-based device disposed within the microfluidic network of channels, wherein the first MEMS-based device is configured to control a temperature of the IC by:
receiving control signals from a controller based on the state of the IC at the first location; and
regulating a temperature at the first location by controlling a mixing of the first fluid and the second fluid in to form a mixed fluid in the third channel based on the control signals.

9. The IC of claim 8, further comprising:
a second sensor configured to measure a state of the IC at a second location of the IC;
a second MEMS-based device is configured to receive control signals based on the state of the IC at the second location and configured to regulate a flow of the fluid in the second channel based on the control signals.

10. The IC of claim 8, wherein the first location is at an internal location of the IC, the state of the IC at the first location corresponds to a state of a component of the IC disposed at the first location of the IC, and the state of the component is at least one of a temperature state of the component, a power state of the component or an operational state of the component.

11. The IC of claim 8, wherein the first sensor is configured to measure the state of the IC at the first location on a real-time basis, and the first MEMS-based device receives the control signals based on changes in the state of the IC at the first location such that a flow of the first fluid in the first channel is regulated on a real-time basis based on the changes in the state of the IC at the first location.

12. The IC of claim 8, wherein the first MEMS-based device is configured by the control signals to change a flow of the first fluid in the first channel when the state of the IC at the first location satisfies a temperature regulating condition.

13. The IC of claim 8, further comprising:
the controller configured to receive measurement information from the first sensor that corresponds to the state of the IC at the first location, and generate the control signals based on the measurement information.

14. The IC of claim 8, wherein the IC is part of a network of ICs, and the first MEMS-based device is configured to receive network control signals based on a state of another IC in the network of ICs and configured to regulate a flow of the mixed fluid in the microfluidic network of channels based on the network control signals.

15. A method of cooling an integrated circuit (IC) including a microfluidic network of channels, at least one sensor and at least one microelectromechanical system (MEMS)-based device disposed within the microfluidic network of channels, the method comprising:
monitoring, by the at least one sensor, a state of the IC;
receiving, by the at least one MEMS-based device, control signals from a controller based on the state of the IC, wherein the at least one MEMS-based device is configured to control a temperature of the IC; and
regulating, by the at least one MEMS-based device, a mixing of a first fluid and a second fluid to form a mixed fluid within the microfluidic network of channels based on the control signals received by the at least one MEMS-based device in order to control the temperature of the IC on a real-time basis based on changes detected in the state of the IC.

16. The method of claim 15, wherein the state of the IC is associated with a temperature at a location within the IC, and the at least one MEMS-based device is configured to regulate a flow of the mixed fluid such that the temperature is regulated on a real-time basis.

17. The method of claim 16, wherein the state of the IC is a state of a component disposed within the IC, and the state of the component is at least one of a temperature state of the component, a power state of the component or an operational state of the component.

18. The IC of claim 1, wherein the second fluid has a higher thermal absorption than the first fluid.

19. The IC of claim 1, wherein the second fluid has a higher compressibility than the first fluid.

* * * * *